United States Patent
Ittah et al.

(10) Patent No.: US 10,504,802 B2
(45) Date of Patent: Dec. 10, 2019

(54) TARGET LOCATION IN SEMICONDUCTOR MANUFACTURING

(71) Applicant: KLA-Tencor Corporation, Milpitas, CA (US)

(72) Inventors: Naomi Ittah, Ramat Gan (IL); Nadav Gutman, Zichron Ya'aqov (IL); Eran Amit, Haifa (IL); Vincent Immer, Zikrom Yaakov (IL); Einat Peled, Haifa (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/576,811

(22) PCT Filed: Oct. 24, 2017

(86) PCT No.: PCT/US2017/058121
§ 371 (c)(1),
(2) Date: Nov. 25, 2017

(87) PCT Pub. No.: WO2018/089190
PCT Pub. Date: May 17, 2018

(65) Prior Publication Data
US 2018/0301385 A1     Oct. 18, 2018

Related U.S. Application Data

(60) Provisional application No. 62/419,889, filed on Nov. 9, 2016.

(51) Int. Cl.
*H01L 21/26* (2006.01)
*G01B 11/14* (2006.01)
(Continued)

(52) U.S. Cl.
CPC .............. *H01L 22/20* (2013.01); *G01B 11/14* (2013.01); *G01B 11/26* (2013.01); *H01L 21/67253* (2013.01); *H01L 22/12* (2013.01)

(58) Field of Classification Search
CPC ... H01L 22/20; H01L 21/67253; G01B 11/26; G01B 11/14
See application file for complete search history.

(56) References Cited

U.S. PATENT DOCUMENTS 7,747,424 B2 * 6/2010 Opsal .................... G01B 11/24
                                                            703/13
9,739,702 B2 * 8/2017 Bringoltz ............ G03F 7/70683
(Continued)

FOREIGN PATENT DOCUMENTS

KR    20160101189 A    8/2016

OTHER PUBLICATIONS

ISA/KR, International Search Report for PCT/US2017/058121 dated Feb. 7, 2018.

*Primary Examiner* — Sang H Nguyen
(74) *Attorney, Agent, or Firm* — Hodgson Russ LLP

(57) ABSTRACT

A method of overlay control in silicon wafer manufacturing comprises firstly locating a target comprising a diffraction grating on a wafer layer; and then measuring the alignment of patterns in successive layers of the wafer. The location of the target may be done by the pupil camera rather than a vision camera by scanning the target to obtain pupil images at different locations along a first axis. The pupil images may comprise a first order diffraction pattern for each location. A measurement of signal intensity in the first order diffraction pattern is then obtained for each location. The variation of signal intensity with location along each axis is then analyzed to calculate the location of a feature in the target.

20 Claims, 3 Drawing Sheets

(51) Int. Cl.
*G01B 11/26* (2006.01)
*H01L 21/67* (2006.01)
*H01L 21/66* (2006.01)

(56) References Cited

U.S. PATENT DOCUMENTS

| | | | |
|---|---|---|---|
| 2005/0012928 A1* | 1/2005 | Sezginer | G01B 11/26 356/401 |
| 2005/0122506 A1* | 6/2005 | Wegmann | G03F 7/706 356/124 |
| 2009/0313589 A1* | 12/2009 | Hsu | G03F 7/70633 716/136 |
| 2011/0155904 A1* | 6/2011 | Hotta | G03F 7/70466 250/307 |
| 2012/0123581 A1* | 5/2012 | Smilde | G03F 7/70483 356/445 |
| 2013/0135600 A1 | 5/2013 | Middlebrooks | |
| 2013/0182263 A1* | 7/2013 | Shchegrov | G01B 9/02 356/512 |
| 2014/0016125 A1* | 1/2014 | Sullivan | G01N 21/9501 356/237.5 |
| 2014/0111791 A1* | 4/2014 | Manassen | G01B 9/02027 356/51 |
| 2014/0146322 A1* | 5/2014 | Hill | G03F 7/70625 356/446 |
| 2014/0351771 A1 | 11/2014 | Amir | |
| 2015/0022822 A1* | 1/2015 | Grunzweig | G01N 21/4788 356/601 |
| 2015/0346605 A1 | 12/2015 | Den Boef | |
| 2015/0355554 A1* | 12/2015 | Mathijssen | G03F 9/7046 355/67 |
| 2016/0146740 A1* | 5/2016 | Lu | G01B 11/272 356/620 |
| 2016/0179019 A1 | 6/2016 | Van Der Schaar | |
| 2016/0291481 A1* | 10/2016 | Smilde | G03F 7/70633 |

* cited by examiner

TARGET LOCATION IN SEMICONDUCTOR MANUFACTURING

CROSS REFERENCE TO RELATED APPLICATIONS

This application claims the benefit of U.S. Provisional Patent Application No. 62/419,889 filed on Nov. 9, 2016, which is incorporated herein by reference in its entirety.

BACKGROUND OF THE INVENTION

1. Technical Field

The present invention relates to the field of metrology, for example but not limited to semiconductor metrology.

2. Discussion of Related Art

Metrology is used in semiconductor manufacturing, for example in overlay control. Semiconductor wafers, e.g. silicon wafers, may be manufactured in a series of layers each consisting of a pattern that must be accurately positioned with respect to patterns in the adjacent layers. The control of this positioning is called overlay control. In some manufacturing processes, a metrology target is provided on the wafer for use in ensuring pattern alignment. The target may take the form of a set of cells, for example a 2×2 array of rectangular or square cells, two for measuring overlay in the X direction and two for measuring overlay in the Y direction. The target may include a diffraction grating. For example, each cell in a target may consist of a diffraction grating. In some overlay control processes it is first necessary to locate the target, e.g. to accurately position a measurement tool such as a camera with respect to the target. The initial target location may be done using a field camera, otherwise known as a vision camera. A pupil camera may then be used in the overlay control process. The term "overlay" is used herein unless otherwise stated to refer to a measurement of the alignment of patterns in successive layers of a wafer.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a method of target location in a semiconductor manufacturing process in which the target is located by the pupil camera. Then, according to some embodiments of the invention, the same camera may be used for target location and overlay control. The target location may be based on the decrease in intensity of the first order diffraction patterns near to the edges of the grating, or cell, relative to the center, for example as a spot emanating from a scanning light source approaches the edges of the grating or cell from the center.

A method according to some embodiments of the invention may comprise scanning the target to capture pupil images at different locations along a first axis, with each pupil image comprising a first order diffraction pattern for each location. The signal intensities of the first order diffraction pattern at each location may then be obtained and analyzed to calculate the location of a feature, such as the center or edge of a cell, in the target.

Thus according to some embodiments of the invention, a field camera is not required to determine the position of the target, and in some systems according to the invention the field camera may be dispensed with. According to some embodiments of the invention, the same optical settings in a metrology tool or system may be used for target acquisition as for overlay measurement. For example the settings used to initially locate a target by its center may also be used to measure any misalignment between successive patterns in different layers in a wafer. Furthermore, for example as well as using the same settings, the same data used to locate the target may be used for overlay measurement, with the possibility of some saving in processing requirements.

Some embodiments of the invention provide a method of overlay control in silicon wafer manufacturing comprising: locating a target comprising a diffraction grating on a wafer layer, for example after initially acquiring the target, and measuring the overlay in successive layers of the wafer. The location of the target may be performed according to any of the methods described herein.

Some embodiments of the invention provide a semiconductor metrology system, also known in the art as a metrology tool, configured to operate according to any of the methods described above.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
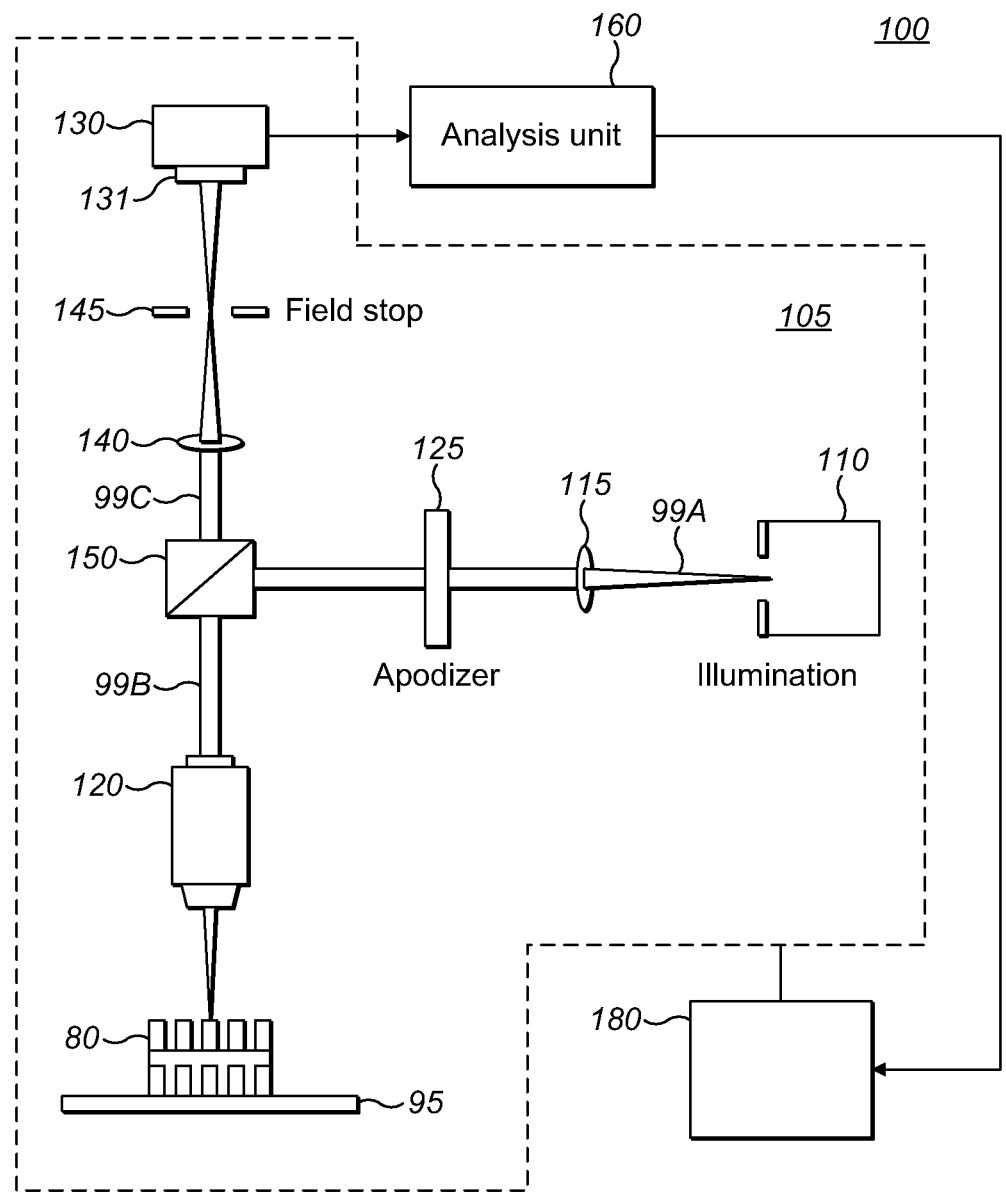
FIG. 1 is a schematic diagram of a system according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein is for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

FIG. 1 is a schematic diagram of a system 100 according to some embodiments of the invention. System 100 comprises an imaging system 105, analysis unit 160 and controller 180. Imaging system 105 comprises an illumination source 110. This may be any suitable illumination source known to those skilled in the art. For example source 110 may be arranged to produce broadband electromagnetic radiation 99A, e.g., having a coherence length of less than 30 microns. In certain embodiments, the illumination may comprise one or more radiation bands in a wide range of the spectrum, e.g. from infrared to deep ultraviolet (e.g., at least one band within a wavelength range of 170-900 nm). In an example, the illumination may be with white light. The coherence length of the illumination may range between sub-microns and tens of microns. The relatively short coherence length of the illumination allows effective phase scanning with high sensitivity to target characteristics.

In the imaging system 105 of FIG. 1, radiation 99A from illumination source 110 passes through collimator 115 via apodizer 125 to beam splitter 150, where radiation 99B is directed via target objective 120 to a target on wafer 80 supported on stage 95. The target includes a diffraction grating, and diffracted radiation is returned from the target on wafer 80, via the objective 120 to the beam splitter 150. System 100 further comprises a pupil camera 130 such as a charge coupled device or "CCD" array arranged to receive diffracted radiation 99C and an analysis unit 160 arranged to analyze images generated by the pupil camera 130. Diffracted radiation 99C is directed by the beam splitter 150 to camera 130 via focus lens 140 and field stop 145. Pupil camera 130 is arranged to form an image from the diffracted radiation 99C at pupil plane 131, as is known in the art.

Controller 180 is configured to control the operation of imaging system 105 including stage 95. Stage 95 may be movable. For example controller 180 may control imaging system 105, and/or the position of the stage 95 supporting the wafer 80, to scan a target on wafer to capture pupil images at different locations on the target. The operation of controller 180 may be based in part on signals from the analysis unit 160.

Figure 2:
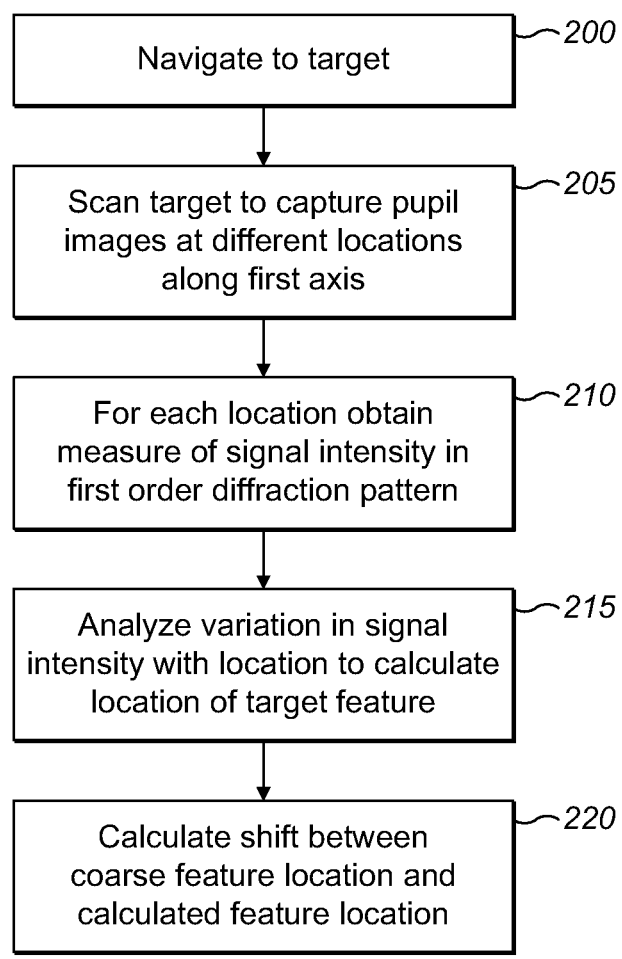
FIG. 2 is a flow diagram of a process according to some embodiments of the invention.

FIG. 2 is a flow chart of a method according to some embodiments of the invention. A method according to some embodiments of the invention may commence after a target has been "acquired" as indicated in operation 200 in FIG. 2, for example by navigating the imaging system 105 to the target. For example, as a result of operation 200, the pupil camera may be positioned so that at least a part of the target, possibly all of the target, is visible by the pupil camera 130. This navigation may be carried out in a manner known in the art and not forming part of this invention. Typically this may be done based on the known predetermined position of the target on the wafer 80. This may be a coarse process in that the target is not at this point accurately positioned with respect to the imaging system 105, for example based on a coarse or low resolution location of a feature of the target such as a cell center or edge.

Figure 3C:
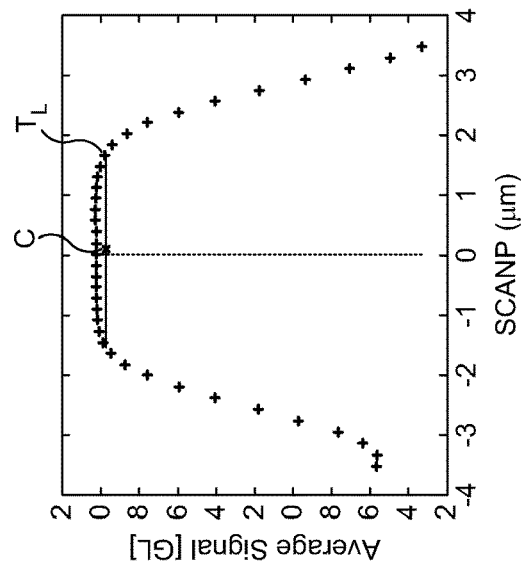
FIG. 3C is a graph showing distribution of intensity with location along an axis crossing one cell in FIG. 3A.
Figure 3B:
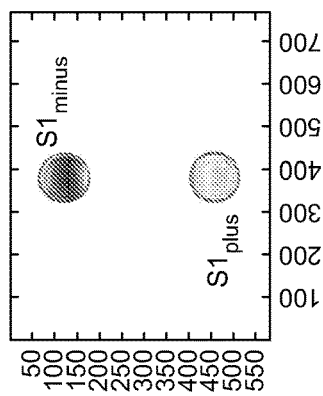
FIG. 3B shows an example of an image captured at one of the locations indicated in FIG. 3A.
Figure 3A:
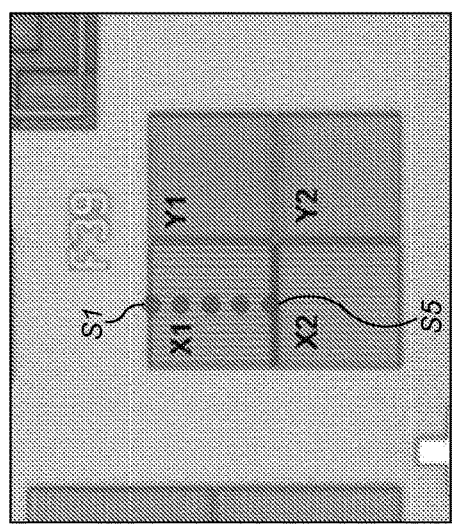
FIG. 3A shows a target and schematically illustrates scanning one cell in the target according to some embodiments of the invention.

In this embodiment, the target comprises a diffraction grating and at least a part of the target is in the field of view of the pupil camera 130. An example of a target is shown in FIG. 3A. In this example the target comprises four rectangular cells labelled X1, X2, Y1, Y2, each comprising a diffraction grating.

A method according to some embodiments of the invention may commence by scanning the target to capture pupil images at different locations along a first axis, at operation 205. In the embodiment shown in FIG. 3, one cell of the target is scanned and the different locations, or scan points, are denoted by spots S1-S5. The locations are spaced along an axis parallel to the side of a cell, and may be centered around the coarse location of the feature, e.g. center of the cell. Only five spots are shown in FIG. 3A but in practice images would be captured for many more locations. For each location, or spot, a pupil image may be captured. Each pupil image may contain a first order diffraction pattern, e.g. a positive first order diffraction pattern and a negative first order diffraction pattern. The term "first order diffraction pattern" is used herein to encompass the positive first order diffraction pattern or the negative first order diffraction pattern or both, since it is not absolutely essential to the invention for both positive and negative diffraction patterns to be present. A pupil image for one spot is shown in FIG. 3B including both positive and negative first order diffraction patterns, S1plus and S1minus. The grey scale in FIG. 3B indicates intensity.

The image shown in FIG. 3B has been captured by masking the radiation reaching the pupil camera so that only the positive and negative first order diffraction patterns are visible. This masking may be carried out through image processing techniques, which may be performed by the analysis unit 160 or at a remote device not shown in FIG. 1. The masking is not essential. According to some embodiments of the invention, instead of masking, one or both positive and negative first order diffraction patterns may be extracted from images by suitable image processing techniques, for example in image analysis unit 160. Any other technique for isolating a diffraction in order to examine its intensity may be used. Thus, the result of operation 205 may be a series of images similar to the single image shown in FIG. 3B, one for each location or spot S1-S5 shown in FIG. 3A, for example all masked in the same way. The series of images may then be analyzed in image analysis unit 160. For this purpose the image analysis unit 160 may comprise one or more processors, as is known in the art.

At operation 210 in FIG. 2, for each location, a measurement of signal intensity in the first order diffraction pattern is obtained, for example by analyzing the images captured in operation 205. This may be done in various ways, for example but not limited to calculating the total intensity or calculating the average intensity of the positive and negative patterns.

At operation 215 in FIG. 2 the variation in signal intensity with location along the axis, for example as obtained in operation 210, may be analyzed to calculate the location of a feature in the target, for example the center or the effective edge of a diffraction pattern or cell. Again this operation may be performed by the image analysis unit 160. One method of doing this is shown in FIG. 3C which is a graph of signal intensity versus location for a series of locations, or scan points, along the scan axis represented by spots S1-S5. It will be noted that there is a central relatively flat region between a sharp rise and fall in intensity. The center of this flat region is determined to correspond to the center of the cell X1. It may not correspond to the central location, or middle spot, e.g. S3 in FIG. 3. The sharp rise and fall correspond to the locations where the spot reaches the edges of the cell. Any known algorithm may be used to calculate the location of the center. For example, some embodiments of the invention may comprise determining an intensity threshold, for example threshold TL shown in FIG. 3C, determining the locations where the intensity crosses the threshold in each direction, for example using curve fitting, and calculating the midpoint between the threshold crossing locations to be the location of the target feature, e.g. the cell center. The intensity threshold may be determined based on the intensity at the center of the image locations, at 0 μm in FIG. 3C. It will be appreciated that the use of a threshold is not essential for calculating the location of the center of the flat region shown in FIG. 3C and other methods which do not use thresholds may be used.

Some embodiments of the invention may include an additional step 220 of calculating a shift between the coarse location of a feature and the location calculated in operation 215. This shift may be for example the difference between the 0 μm position in FIG. 3C and the calculated center of a cell which is shown in FIG. 3C to be slightly to the right of the 0 μm position. In the example of FIG. 3C the 0 μm position was determined using a field camera rather than a more coarse initial estimate and therefore illustrates that the measurement accuracy is comparable to if not better than that obtained with a field camera. According to some embodiments of the invention the wafer may be moved by an amount corresponding to the shift, for example by moving the stage 95 on which it is supported. Thus in a system according to some embodiments of the invention the controller 180 may be configured to control movement of the stage 95 according to the calculated location of the feature.

The foregoing operations, e.g. scanning, obtaining signal intensity measurements, analyzing intensity variation, may be repeated along a second axis, e.g. perpendicular to the line joining spots S1-S5, to determine a position vector (x,y) for the feature, e.g. cell center. Then a shift along both x and y axes may be calculated and the wafer may be moved by a corresponding amount in both directions.

In some embodiments of the invention, more than one cell of a target may be scanned. For example two or more cells may be scanned along an axis continuing from one cell to another. A scan of two cells may result in an intensity distribution with two flat regions similar to the single flat region shown in FIG. 3C, and this may be used, optionally in conjunction with a scan along a second different axis, to locate a feature of each cell, such as the cell center or effective edge. Then a shift may be calculated for each cell which may be used to verify or to improve the accuracy of a shift calculated using images from one cell only.

It will be appreciated that the foregoing methods of target location according to embodiments of the invention may form part of a method of overlay control in silicon wafer manufacturing in which a target is located by any of the methods described herein and pattern alignment in successive layers is then measured. The same pupil camera used in the target location may be used in overlay measurement. The target location and overlay measurement may require no change in the settings of the imaging system 105 to perform both operations. Moreover, according to some embodiments of the invention, only one image capturing operation may be required to enable target location and overlay, or alignment, measurement. For example, the same pupil images used in the calculation of the location of a feature in the target may be analyzed for overlay measurement.

Some embodiments of the invention may provide methods and systems having numerous advantages over methods and systems of the prior art. For example, there is no need for a vision camera, otherwise known as a field camera, and therefore the manufacture of a system may be simplified. Thus systems according to some embodiments of the invention do not comprise a vision or field camera. According to some embodiments of the invention there is no need to use different optical settings during running of an overlay measurement process and therefore time may be saved. Calibration of spot location may not be required since according to some embodiments of the invention using a method as described herein the location of an illumination spot on a cell may be directly determined using the pupil camera alone. This is in contrast to prior art methods in which the target location is found using a vision camera and it is then necessary to separately determine the spot location offset from the center of the field of view of the vision camera. Further, target noise may be calculated on the fly using the same data collected for target location which relates pupil images to target location This may for example enable the generation of real time wafer statistics which might for example lead to a decision to skip a target location operation e.g. because the target is too noisy and cannot be relied on for accuracy. Also, according to some embodiments of the invention, pupil images captured "on the fly" at scan points around the center of a cell, such as the scan points S1-S5 shown in FIG. 3A, may be used to calculate overlay. This may avoid the need for separate steps of moving the spot to the center position of the cell and capturing new spot images, e.g. diffraction patterns, for overlay measurement.

It should also be noted that target location using a vision camera is sensitive to light and focus which can affect matching results between different metrology systems or tools. Methods and systems according to the present invention may not be sensitive in this way since they are based on the physical behavior of the decrease in intensity of the positive and negative first order (1st and −1st) diffraction patterns when the spot is reaching the cell edges.

Some embodiments of the invention may be performed using existing systems, controlled in a different manner so that target location is performed using the pupil camera. In such embodiments a system may be enabled to operate according to the invention through different software, implemented for example in a processor in controller 180. Thus some embodiments of the invention provide a computer readable medium, transitory or non-transitory, comprising instructions which when implemented in a processor of a semiconductor metrology system cause the system to operate according to any of the methods described herein.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method of target location in a semiconductor manufacturing process, wherein a target comprises a diffraction grating, the method comprising:

acquiring the target based on a coarse location of a feature;

scanning the target to capture pupil images at different locations along a first axis and a second axis, wherein the pupil images comprise a first order diffraction pattern for each of the different locations, and wherein the second axis is perpendicular to the first axis;

obtaining a measurement of signal intensity in the first order diffraction pattern for each of the different locations;

analyzing a variation of signal intensity with location along the first axis and the second axis to calculate a position vector of the feature of the target along the first axis and the second axis; and calculating a shift between the coarse location and the calculated position vector by an image analysis unit.

2. The method of claim 1 wherein the first order diffraction pattern comprises positive and negative first order diffraction patterns.

3. The method of claim 2 wherein obtaining a measurement of signal intensity comprises calculating an average signal intensity or a total signal intensity of the positive and negative first order diffraction patterns.

4. The method of claim 2 wherein the feature is a center of the target.

5. The method of claim 1 wherein the feature is a center of the target.

6. The method of claim 1 wherein said target comprises a plurality of cells, said scanning comprises scanning a single cell, and said feature comprises a center of said single cell or an edge of said single cell.

7. The method of claim 1 wherein said target comprises a plurality of cells, said scanning comprises scanning more than one cell along an axis continuing from one cell to another, and said feature comprises a boundary between two cells, an edge of a cell, or a center of a cell.

8. A computer readable medium comprising instructions which when implemented in a processor of a semiconductor metrology system cause the system to operate according to the method of claim 1.

9. The method of claim 1, further comprising moving the target an amount along the first axis and the second axis that corresponds to the position vector.

10. A method of overlay control in silicon wafer manufacturing comprising:
acquiring a target based on a coarse location of a feature;
locating the target comprising a diffraction grating on a wafer layer;
measuring an overlay in successive layers of the wafer;
wherein locating the target comprises:
scanning the target to capture pupil images at different locations along a first axis and a second axis, wherein the pupil images comprise a first order diffraction pattern for each of the different locations, and wherein the second axis is perpendicular to the first axis;
obtaining a measurement of signal intensity in the first order diffraction pattern for each of the different locations; and
analyzing a variation of signal intensity with location along the first axis and the second axis to calculate a position vector of the feature in the target along the first axis and the second axis; and
calculating a shift between the coarse location and the calculated position vector by an image analysis unit.

11. The method of claim 10 comprising moving the wafer by an amount corresponding to the shift.

12. The method of claim 10 wherein the same camera is used to locate the target and measure the overlay.

13. The method of claim 12 wherein the same measurement settings for a pupil camera are used for locating the target and for measuring alignment.

14. The method claim 10 wherein signal intensity data used to determine the location of said feature is used to measure alignment of patterns in successive layers of the wafer.

15. The method claim 10 wherein signal intensity data used to determine the location of said feature is used to measure alignment of patterns in successive layers of the wafer.

16. A semiconductor metrology system comprising:
an imaging system comprising an illumination source for illuminating a target based on a coarse location of a feature on a wafer and a pupil camera for capturing light returned from said target;
a controller configured to control the imaging system to scan the target to capture pupil images at different locations along a first axis and a second axis, wherein the pupil images comprise a first order diffraction pattern for each of the different locations along the first axis and the second axis, and wherein the second axis is perpendicular to the first axis; and
an image analysis unit configured to obtain a measurement of signal intensity in the first order diffraction pattern for each of the different locations along said first axis and the second axis, analyze variation of signal intensity with location along the first axis and the second axis to calculate a position vector of a feature in the target along the first axis and the second axis, and calculate a shift between the coarse location and the calculated position vector.

17. The system of claim 16 further configured to measure alignment of patterns in successive layers of the wafer using data from said pupil images.

18. The system of claim 17 comprising a movable stage for supporting the wafer in which the controller is configured to control movement of the stage according to the calculated location of the feature.

19. The system of claim 16 comprising a movable stage for supporting the wafer in which the controller is configured to control movement of the stage according to the calculated location of the feature.

20. The system of claim 16, wherein:
the imaging system further comprises:
a beam splitter;
a collimator disposed between the beam splitter and the illumination source along a first optical axis, wherein the first optical axis passes through the beam splitter and the illumination source;
an apodizer disposed between the beam splitter and the collimator along the first optical axis;
a movable stage for supporting the wafer in which the controller is configured to control movement of the stage according to the calculated location of the feature;
an objective disposed between the beam splitter and the wafer along a second optical axis, wherein the second optical axis passes through the beam splitter and the movable stage;
a focus lens disposed between the beam splitter and the pupil camera disposed along a third optical axis, wherein the third optical axis passes through the beam splitter and the pupil camera; and
a field stop disposed between the focus lens and the pupil camera along the third optical axis; and
the controller is configured to receive electronic input from the image analysis unit.

* * * * *